US008014168B2

(12) United States Patent
Lanning et al.

(10) Patent No.: US 8,014,168 B2
(45) Date of Patent: Sep. 6, 2011

(54) WIRE FORM RAIL ADAPTER

(75) Inventors: Scott Raymond Lanning, Conway, PA (US); Roger William Helms, Beaver Falls, PA (US)

(73) Assignee: Eaton Corporation, Cleveland, OH (US)

( * ) Notice: Subject to any disclaimer, the term of this patent is extended or adjusted under 35 U.S.C. 154(b) by 397 days.

(21) Appl. No.: 12/369,145

(22) Filed: Feb. 11, 2009

(65) Prior Publication Data

US 2010/0203774 A1 Aug. 12, 2010

(51) Int. Cl.
*H05K 7/14* (2006.01)

(52) U.S. Cl. ........... 361/807; 42/117; 248/424; 312/440

(58) Field of Classification Search .................... 174/58, 174/53, 68.1; 312/333, 440, 265.3, 240, 312/334.4; 439/716, 121, 119, 212; 42/72, 42/94, 117, 105, 71.1; 710/100, 301; 248/637, 248/418, 424, 27.1, 125.1, 278.1; 361/679.03, 361/679.43, 679.01, 679.21, 679.04, 679.22, 361/679.23, 679.27, 807

See application file for complete search history.

(56) References Cited

U.S. PATENT DOCUMENTS

| | | | | |
|---|---|---|---|---|
| 7,521,631 | B2 * | 4/2009 | Dinh | 174/58 |
| 2003/0122117 | A1 * | 7/2003 | Brown | 256/67 |
| 2008/0174945 | A1 * | 7/2008 | Lee et al. | 361/681 |

OTHER PUBLICATIONS

"Assembly Drawing for Eaton/Cutler-Hammer 50mm Definite Purpose Contactor", Dated Dec. 13, 2004.

"Product Information Sheets for Eaton-Cutler-Hammer 50 mm Definite Purpose Contactor", Dated Apr. 2009.

* cited by examiner

*Primary Examiner* — Hung V Duong

(57) ABSTRACT

A wire form rail adapter for use in connecting an electrical component to a mounting rail includes a wire form spring clip that is formed to provide both a connection portion and a spring portion. The connection portion is configured to selectively engage the mounting rail and retain the rail against the rail adapter. The spring portion is configured to provide a biasing force that urges the wire form spring clip toward a position in which the connection portion engages the mounting rail.

15 Claims, 3 Drawing Sheets

WIRE FORM RAIL ADAPTER

BACKGROUND

For industrial applications electrical components are commonly mounted on rails inside equipment racks. The mounting rails often have an industry-standard configuration, such as, for example, the DIN rail. DIN rails have a top-hat cross section that includes a middle section between two edge flanges. One standard DIN rail has a 35 mm width. In use, electrical components are clamped to the edge flanges and span the middle section. To facilitate mounting to various rail configurations, electrical components are often designed to be mounted to a rail adapter that is appropriately dimensioned for a specific rail. The rail adapter includes a back plate having mounting features for the electrical component and a rail connection mechanism that is configured to connect the rail adapter, and the electrical component it carries, to the rail.

SUMMARY

In one embodiment, a rail adapter is provided for connecting an electrical component to a mounting rail having two spaced elongate mounting flanges on either side of an elongate middle portion. The rail adapter includes a back plate and a wire spring clip. In one example embodiment, the back plate also includes a fixed rail mounting feature configured to engage a first of the two mounting flanges to connect the first mounting flange to the back plate. The back plate may also include one or more spring clip mounting features, and a spring stop.

The wire spring clip is moveably retained in the one or more spring clip mounting features. The wire spring clip is configured to be moved relative to the back plate between an engagement position in which the wire spring clip captures a second of the two mounting flanges between the wire spring clip and the back plate and a release position in which the wire spring clip is released from the second mounting flange. The wire spring clip is made of a length of wire shaped to form a connection portion and a spring portion. The connection portion is configured to capture the second mounting flange against the back plate when the wire spring clip is in the engagement position. The spring portion is configured to co-act with the one or more spring stop features to urge the wire spring clip towards the engagement position.

In one particular embodiment, the connection portion includes two ears spaced apart from one another. Each ear is configured to overlay the second mounting flange and capture the second mounting flange against the back plate when the wire spring clip is in the engagement position. In this embodiment the spring portion includes a flat spring formed by a portion of the length of wire spanning between the two ears. The flat spring contacts the spring stop at a longitudinal side between the ears when the wire spring clip is in the release position such that the flat spring flexes against the spring stop away from a relaxed position and urges the wire spring clip back toward the engagement position.

In one embodiment, a method is provided that connects an electrical component to a mounting rail having two spaced elongate mounting flanges on either side of an elongate middle portion. The method includes connecting the electrical component to a back plate and fixing a first of the two mounting flanges to a fixed rail mounting feature on the back plate. A force is applied to a wire spring clip that is moveably retained on the back plate. The wire spring clip includes a length of wire shaped to form a connection portion and a flat spring. The connection portion is configured to capture the second mounting flange against the back plate when the wire spring clip is in an engagement position. The flat spring is configured to flex against one or more spring stop features and to provide a biasing force that urges the wire spring clip towards the engagement position.

The force is sufficient to overcome the urging of the spring portion toward the engagement position and to move the wire spring clip to a release position such that the connection portion is not positioned to overlay the second of the two mounting flanges. The second mounting flange is placed against the back plate; and the force on the wire spring clip is released so that the biasing force of the flat spring moves the wire spring clip to the engagement position so that the connection portion captures the second mounting flange against the back plate.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
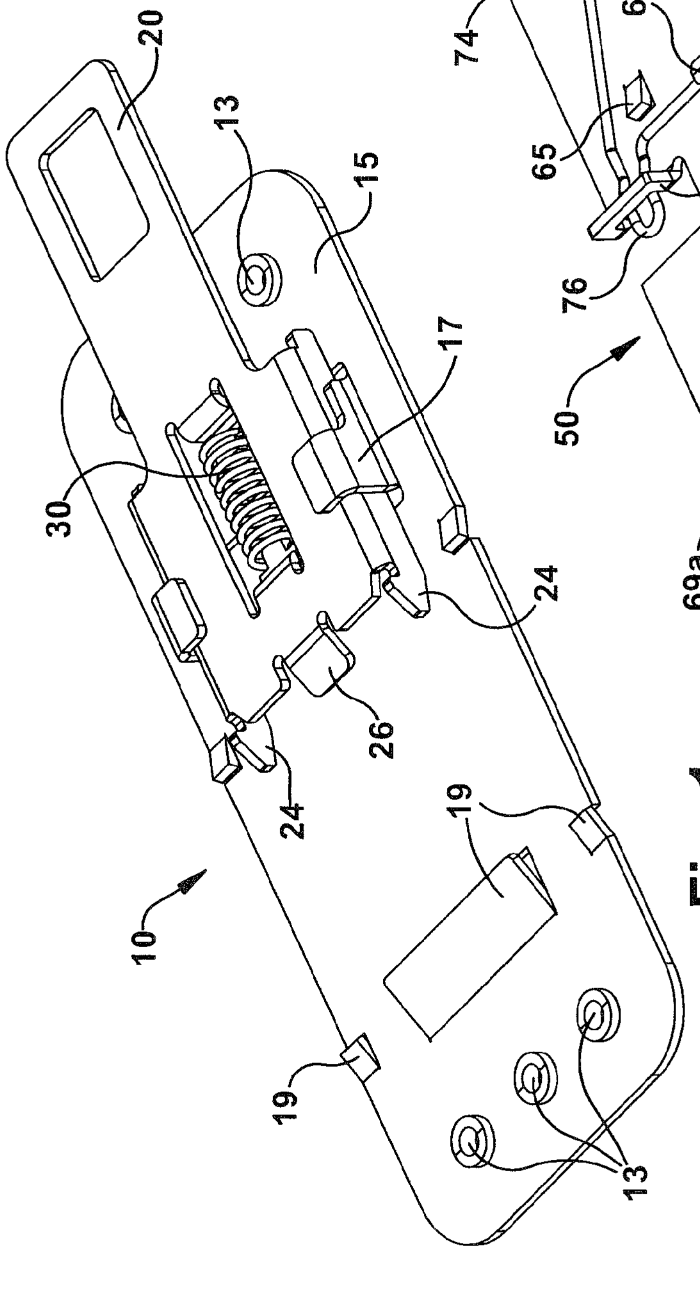
Fig. 1 (Prior Art)
FIG. 1 is a perspective view of a prior art rail adapter.

FIG. 1 illustrates a prior art rail adapter 10. The rail adapter 10 includes a back plate 15 and a slider clip 20. The back plate 15 includes mounting holes 13 that are dimensioned so that one or more types of electrical components may be mounted to the back plate 15 using the holes 13 and fasteners (not shown). The back plate 15 also includes three tabs 19 that are cut from the back plate 15 and bent upward to form a channel into which a first mounting flange of a mounting rail (not shown) may be inserted.

The back plate 15 includes two slider clip mounting flanges 17. The slider clip 20 is slideably retained in these mounting flanges 17 and is free to move along the back plate toward and away from the tabs 19. The slider clip 20 rides on two clip rails 24 that are configured to engage a second mounting flange of the mounting rail when the slider clip 20 is moved toward the tabs 19. The clip rails 24 release the second mounting flange when the slider clip 20 is moved away from the tabs 19. A compression spring 30 is coupled between the slider clip 20 and the back plate 15. The compression spring 30 provides a biasing force on the slider clip 20 relative to the back plate 15 that tends to urge the slider clip toward the tabs 19 and into engagement with the second mounting flange when a second mounting flange is present. As can be seen from FIG. 1, the prior art rail adapter 10 includes a stamped metal part (slider clip 20) and a separate compression spring 30.

Figure 2:
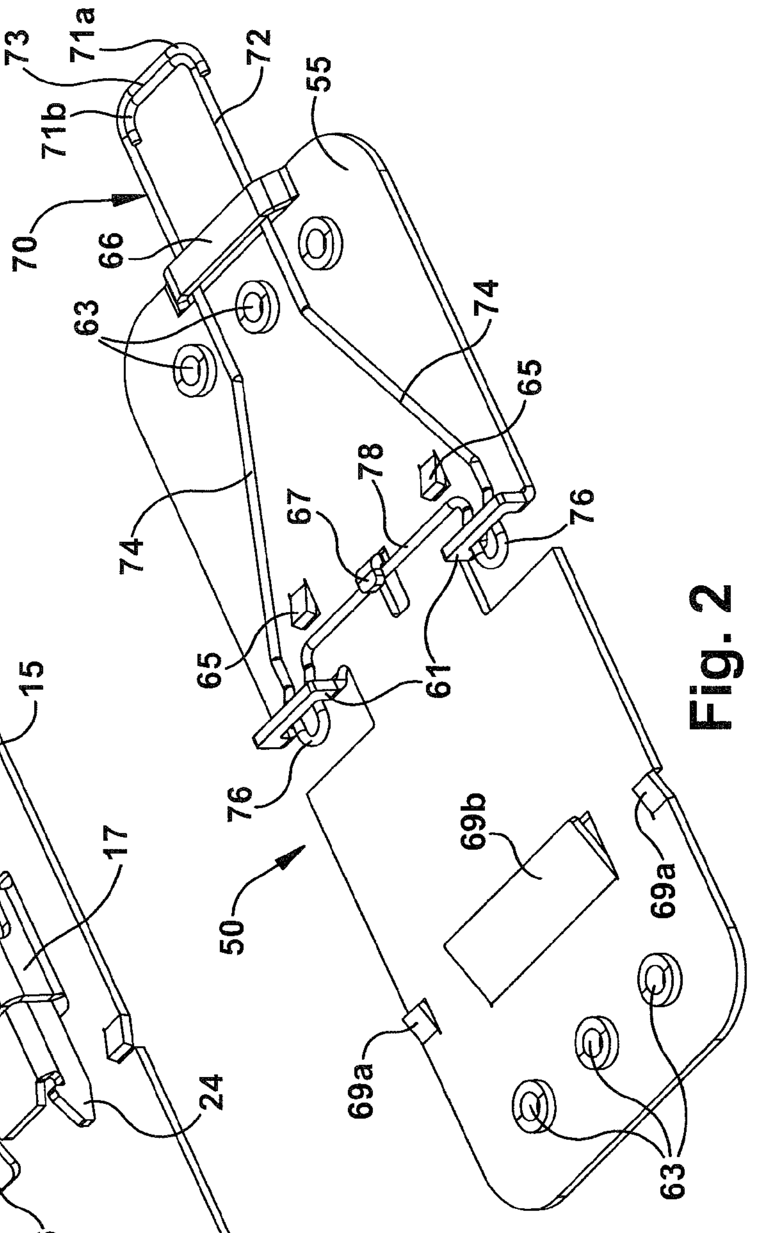
FIG. 2 is a perspective view of an example embodiment of a wire form rail adapter.

FIG. 2 is a perspective view of one example embodiment of a wire form rail adapter 50 that includes a wire form spring clip 70 and a back plate 55. The wire form spring clip 70 is made from a length of wire and that is formed to provide at least one connection portion and a spring portion The connection portion selectively engages the second mounting flange (indicated as 95 in FIG. 3). The spring portion provides a biasing force on the wire form spring clip 70 to urge the wire form spring clip into engagement with the second mounting flange. In one embodiment the wire form spring clip is formed from a continuous length of music wire having a diameter of 0.045 inch. Of course, several lengths of wire may be combined to form the wire form spring clip 70, and any other suitable type of wire may be used.

The wire form spring clip 70 is made of a length of wire 70 that is bent to form several features. In some embodiments it is possible to form the features without hard tooling by using, for example, a CNC wire bending machine. The wire form spring clip 70 includes at least one connection portion that is configured to capture the mounting flange against the back plate 55. In the illustrated embodiment, the connection portion is a pair of ears 76 that are formed into the length of wire 71. As can also be seen in FIGS. 3A and 3B, the ears 76 are angled upward from a plane in which the rest of the wire form spring clip 70 lays. This angling provides clearance between the ears 76 and the back plate 55 in which the mounting flange may be captured. Of course, any number of connection portion configurations may be used in which the wire is formed to provide a connection portion that is capable of capturing the mounting flange against the back plate. Additionally, any number of ears could be used in practice of the invention.

In the embodiment illustrated in FIGS. 2-5, the spring portion is a flat spring 78 that is disposed between the ears 76. The flat spring is proximate to a spring stop 67 in its relaxed position and may contact the spring stop in its relaxed position. The flat spring is configured so that when the spring is in its relaxed position, the wire form spring clip 70 is positioned to engage the mounting flange. When the wire form spring clip 70 is moved away from the mounting flange to release the mounting flange (see FIG. 3B), the flat spring 78 flexes against the spring stop to allow the ears 76 to clear the mounting flange.

The wire form spring clip 70 shown in FIGS. 2-5 includes an extension portion 72 at an opposite end from the ears 76 and flat spring 78. The extension portion 72 is configured to be gripped by a hand or tool when the wire form rail adapter 50 is being installed on or removed from a mounting rail. The extension portion 72 includes an end portion 73. In the described embodiment the end portion 73 includes the ends 71*a*, 71*b* of the length wire 71. The wire form spring clip 70 also includes a body portion 74 that includes two tapering portions of the length of wire that connect the extension portion 72 to the ears 76.

In the illustrated embodiment, the back plate 55 is made from stamped metal having a thickness of approximately 0.050 inches. However, any suitable material may be used. The back plate 55 includes connection portion guides that constrain motion of the connection portions with respect to the back plate 55. In the illustrated embodiment, the connection portion guides are ear guide flanges 61 that are formed by bending cut out portions of the back plate 55 upward to a perpendicular orientation with the rest of the back plate. The ear guide flanges 61 include a central opening through which the ear 76 protrudes. The ear guide flanges 61 constrain motion of the ears 76 away from the back plate and thereby limit motion of the wire form spring clip 70 to motion parallel to the back plate.

In the illustrated embodiment, the spring stop 67 is formed by bending a cut out portion of the back plate 55 to form a finger that projects perpendicularly from the back plate and curls over at its distal end to surround the wire 71. The wire form spring clip 70 contacts the spring stop 67 when the wire form spring clip 70 is moved away from the mounting flange. Flexure of the flat spring 78 against the spring stop 67 allows the wire form spring clip 70 to release the mounting flange.

Other back plate features that interact with the wire form spring clip 70 include spring limiters 65 and an end guide flange 66. The spring limiters 65 limit motion of the wire form spring clip 70 away from the mounting flange. The spring limiters 66 thus may prevent over-flexing of the flat spring 78 that could damage or destroy the flat spring. The end guide flange 66 in conjunction with the rest of the back plate forms a channel through which the extension portion may travel parallel to the back plate while having limited motion away from the back plate.

The back plate 55 includes component mounting features in the form of mounting holes 63. The mounting holes 63 can be used to mount any number of electrical components, such as, for example, circuit breakers, terminal blocks, relays, timers, or contactors, to the rail adapter 50. Of course, other mounting features, such as snap fit features or adhesives may be used to connect the electrical component to the rail adapter. The back plate also includes a rail mounting tab 69*a*, 69*b* that are formed by bending cut out portions of the back plate upward to create a channel into which the first mounting flange may be inserted. The rail mounting tabs 69*a* hold the rail from moving laterally while the rail mounting tab 69*b* holds the rail against the back plate 55. As can be seen from FIGS. 2, 3A and 3B, the rail mounting tabs 69*a*, 69*b*, ear guide flanges 61, spring stop 67, spring limiters 65, and end guide flange may all be formed from cut-out portions of the back plate that are subsequently bent into shape.

Figure 3A:
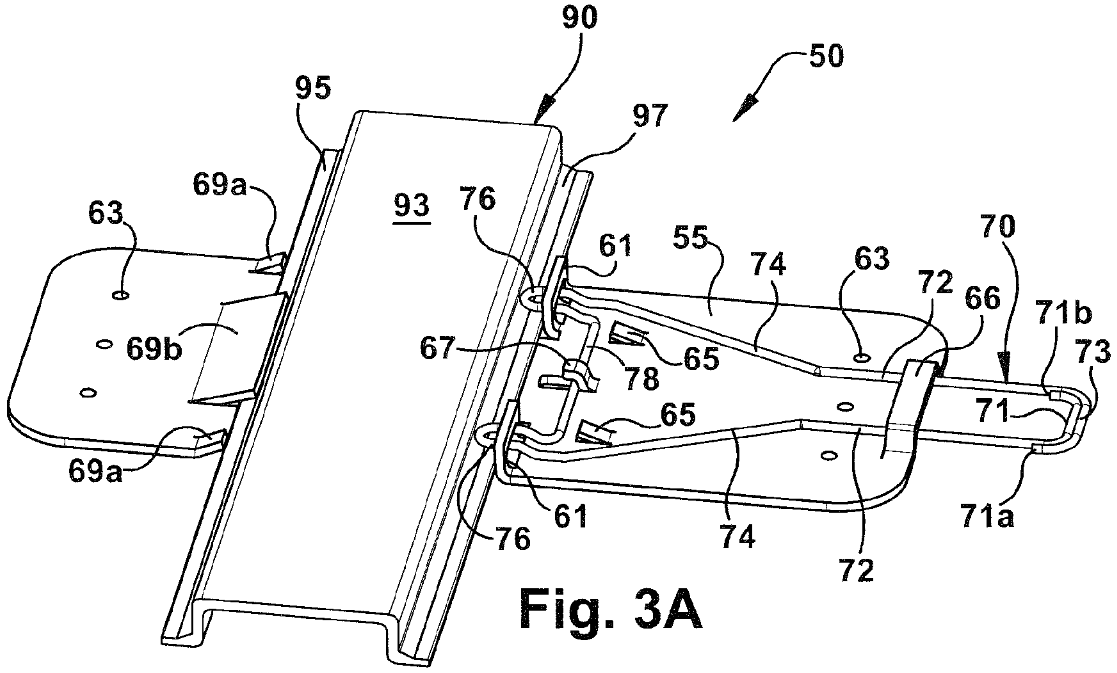
FIGS. 3A and 3B are perspective views of the wire form rail adapter of FIG. 2 installed on a DIN rail.
Figure 4:
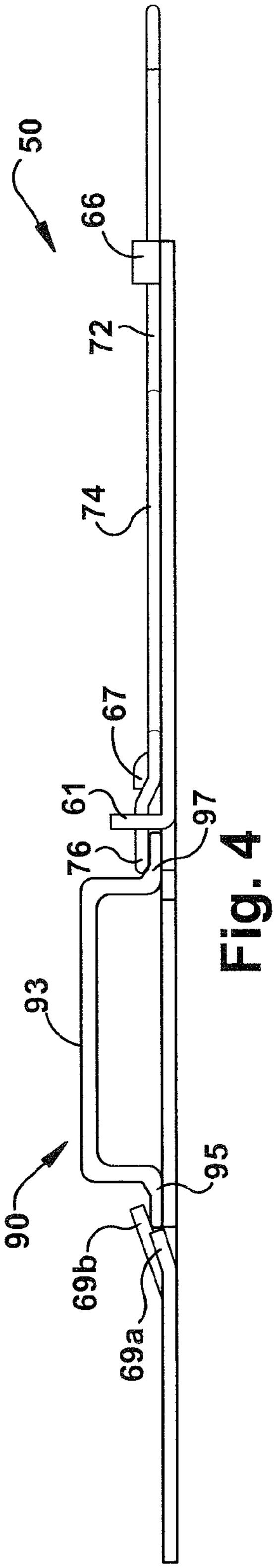
FIG. 4 is a side plan view of the wire form rail adaptor of FIGS. 3A and 3B.
Figure 5:
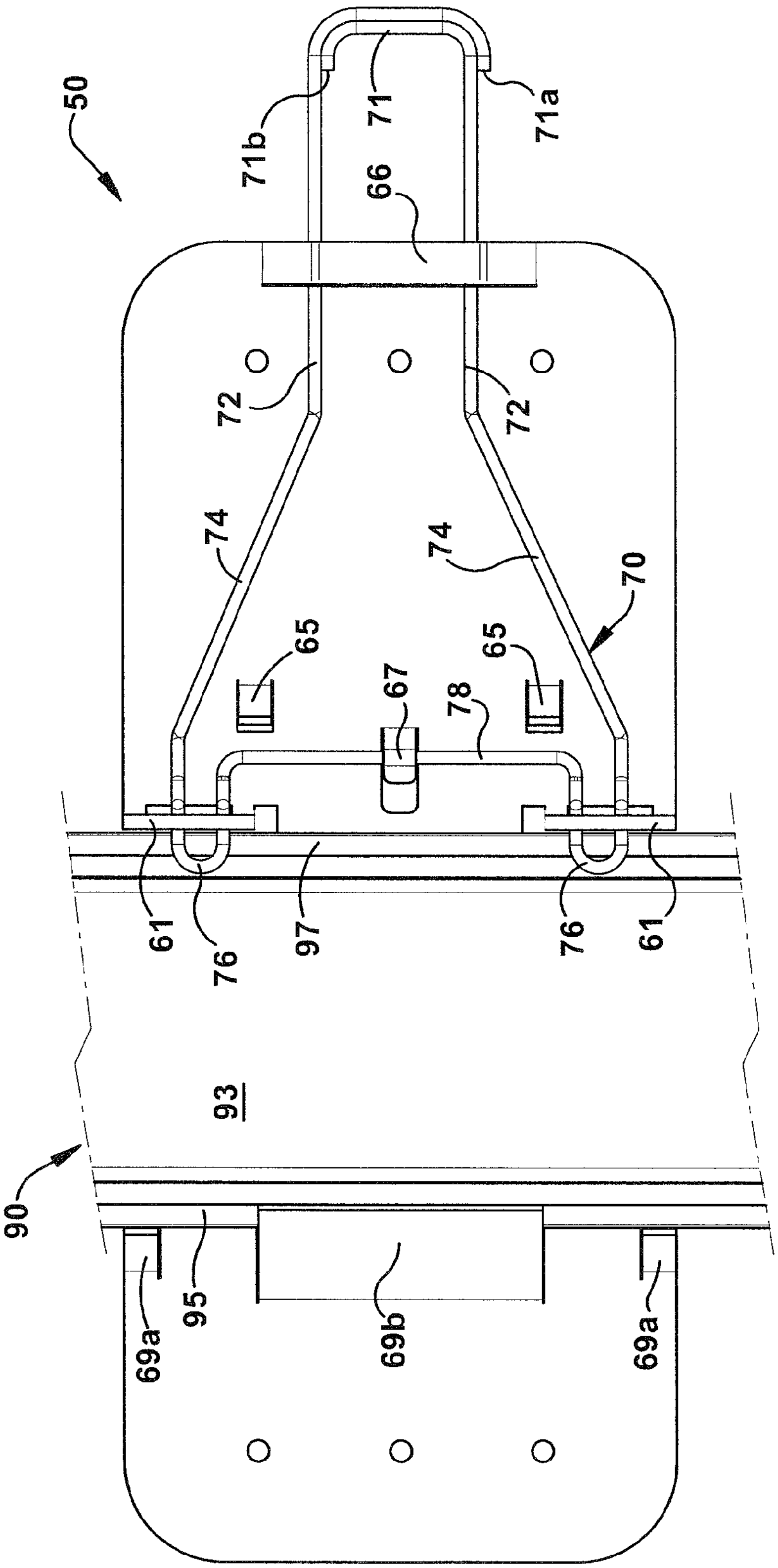
FIG. 5 is a top plan view of the wire form rail adaptor of FIGS. 3A and 3B.

FIGS. 3A, 4, and 5 show a wire form rail adapter 50 installed on a mounting rail 90. A first mounting flange 95 of the mounting rail 90 is inserted in the channel formed by rail mounting tab 69*b*. The wire form spring clip 70 is in an engagement position in which the flat spring 78 is in a substantially relaxed position. The ears 76 capture a second mounting flange 97 against the back plate 55. The flat spring 78 in conjunction with the spring stop 67 provides a biasing force that maintains the wire form spring clip 70 in the engagement position shown in FIG. 3A.

Figure 3B:
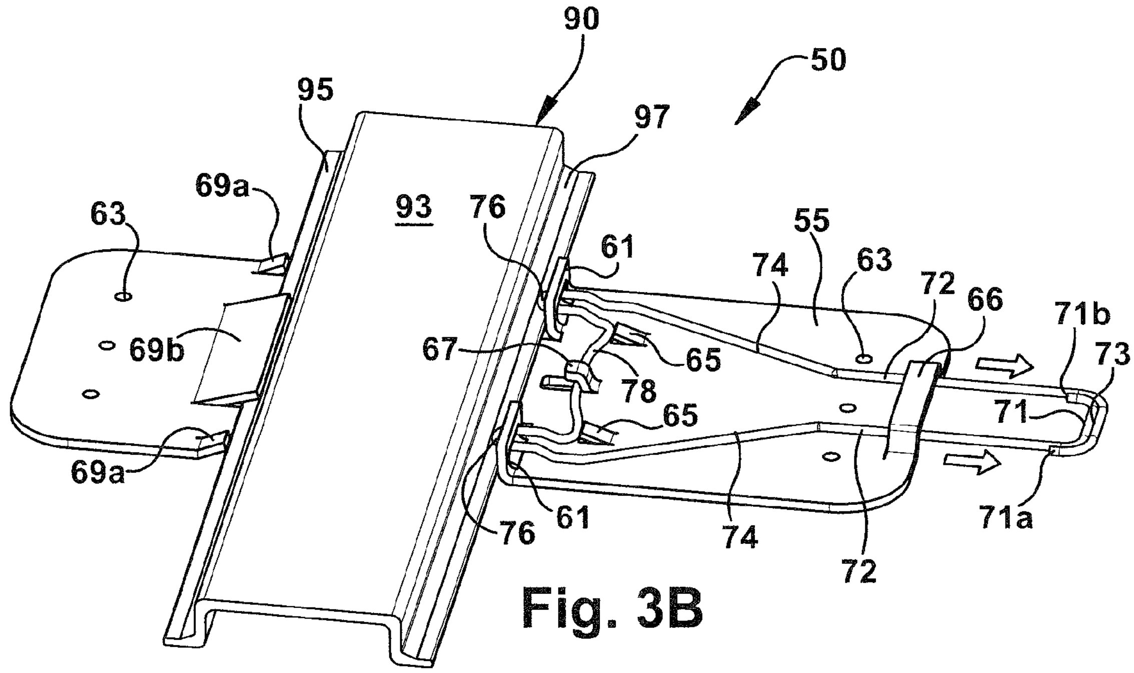

FIG. 3B shows the wire form spring clip 70 in a release position that allows the rail adapter to be removed from or installed to the mounting rail 90. A force sufficient to overcome the biasing force of the flat spring 78 has been applied to the wire form spring clip 70 in the direction shown by the arrows. The flat spring 78 flexes against the spring stop 67 and the ears 76 slide away from the second mounting flange 97 so that they no longer overlay and capture the mounting flange.

As can be seen from the above description a wire form rail adaptor includes wire form spring clip that incorporates both a connection portion and a spring portion formed from a length of wire. This wire form spring clip thus performs two functions, connection and biasing, with a single part.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

What is claimed is:

1. A rail adapter for connecting an electrical component to a mounting rail having two spaced elongate mounting flanges on either side of an elongate middle portion, the rail adapter comprising:

a back plate comprising:

a fixed rail mounting feature configured to engage a first of the two mounting flanges to connect the first mounting flange to the back plate;

one or more spring clip mounting features; and a spring stop; and a wire spring clip moveably retained in the one or more spring clip mounting features and configured to be moved relative to the back plate between an engagement position in which the wire spring clip captures a second of the two mounting flanges between the wire spring clip and the back plate and a release position in which the wire spring clip is released from the second mounting flange, the wire spring clip comprising a length of wire shaped to form:

a connection portion configured to capture the second mounting flange against the back plate when the wire spring clip is in the engagement position; and a spring portion configured to co-act with the one or more spring stop features to urge the wire spring clip towards the engagement position.

2. The rail adapter of claim 1 where the connection portion comprises a U-shaped ear configured to overlay the second mounting flange and capture the second mounting flange against the back plate when the wire spring clip is in the engagement position.

3. The rail adapter of claim 1 where the spring portion comprises a portion of the length of wire defined by first and second spring portion distal ends, the spring portion forming a flat spring that contacts the spring stop at a longitudinal side between the distal ends when the wire spring clip is in the release position such that the flat spring flexes against the spring stop away from a relaxed position and urges the wire spring clip back toward the engagement position.

4. The rail adapter of claim 1 where:

the connection portion comprises two ears spaced apart from one another, each ear configured to overlay the second mounting flange and capture the second mounting flange against the back plate when the wire spring clip is in the engagement position; and where the spring portion comprises a portion of the length of wire spanning between the two ears that forms a flat spring, the flat spring contacting the spring stop at a longitudinal side between the ears when the wire spring clip is in the release position such that the flat spring flexes against the spring stop away from a relaxed position and urges the wire spring clip back toward the engagement position.

5. The rail adapter of claim 1 where the one or more spring clip mounting features comprise a connection portion guide that defines an opening through which the connection portion protrudes, the connection portion guide constraining movement of the connection portion away from the back plate and sized to guide the connection portion into contact with the second mounting flange when the wire spring clip is in the engagement position.

6. The rail adapter of claim 1 where the connection portion guide comprises a bent flange formed by bending a cut portion of the back plate to a substantially perpendicular position with respect to a remainder of the back plate.

7. The rail adapter of claim 1 where the wire spring clip comprises a single, continuous, length of wire.

8. The rail adapter of claim 1 where the wire spring clip comprises a length of wire that is shaped to form:

an extension portion formed by two substantially linear portions of the wire disposed parallel to one another and connected to one another at a distal end by a end portion of the wire;

a spring clip body formed by two spaced apart substantially linear body portions of the wire each connected at a first distal end to the extension portion, each body portion being disposed such that the body portion angles away from the other body portion;

a connection portion comprising two U-shaped ears each having two legs, each U-shaped ear being connected at a first leg to one of the body portions; and a flat spring formed by the wire between second legs of each U-shaped ear, the flat spring comprising a portion of the length of wire having a relaxed shape configured to co-act with the spring stop to urge the wire spring clip toward the engagement position.

9. The rail adapter of claim 1 where the spring stop comprises a bent finger formed by bending a cut-out portion of the back plate such that the finger protrudes substantially perpendicular to a remainder of the back plate and curls over at a distal end to surround a portion of the wire about a diameter of the wire.

10. The rail adapter of claim 1 where the back plate comprises a spring clip limiter positioned to define an end of travel of the wire spring clip toward the release position, the spring clip limiter positioned to contact the wire spring clip when the wire spring clip is moved out of an overlaying position with respect to the second mounting flange and impede further motion of the wire spring clip in a direction away from the second mounting flange.

11. A rail adapter for connecting an electrical component to a mounting rail having two spaced elongate mounting flanges on either side of an elongate middle portion, the rail adapter comprising:

a back plate comprising:

a component mounting feature configured to co-act with a mounting feature on the electrical component to fix the electrical component to the back plate;

a fixed rail mounting feature configured to engage a first of the two mounting flanges to connect the first mounting flange to the back plate;

a wire spring clip moveably retained in the one or more spring clip mounting features and configured to be moved relative to the back plate between an engagement position in which the wire spring clip captures a second of the two mounting flanges between the wire spring clip and the back plate and a release position in which the wire spring clip is released from the second mounting flange, the wire spring clip comprising a continuous length of wire shaped to form:

an extension portion formed by two substantially linear portions of the wire disposed parallel to one another and connected to one another at a distal end by a connecting portion of the wire;

a spring clip body formed by two substantially linear body portions of the wire each connected at a first distal end to the extension portion, each body portion being disposed such that the body portion angles away from the other body portion;

two U-shaped ears each having two legs, each U-shaped ear being connected at a first leg to one of the body portions and configured to overlay the second mounting flange and capture the second mounting flange against the back plate when the wire spring clip is in the engagement position; and a flat spring formed by the wire spanning between second legs of each U-shaped ear, the flat spring comprising a portion of the length of wire having a relaxed shape configured to co-act with the spring stop to urge the wire spring clip toward the engagement position; and where the back plate further comprises:

an ear guide that defines an opening through which the ear protrudes, the ear guide constraining movement of the ear away from the back plate and sized to guide the ear into contact with a second of the two mounting flanges when the wire spring clip is in the engagement position, the ear guide comprising a bent flange formed by bending a cut portion of the back plate to a substantially perpendicular position with respect to a remainder of the back plate; and a spring stop comprising a bent finger formed by bending a cut-out portion of the back plate such that the finger protrudes substantially perpendicular to a remainder of the back plate and curls over at a distal end to surround a portion of the flat spring about a diameter of the wire.

12. A method that connects an electrical component to a mounting rail having two spaced elongate mounting flanges on either side of an elongate middle portion, the method comprising:

connecting the electrical component to a back plate;

fixing a first of the two mounting flanges to a fixed rail mounting feature on the back plate;

applying a force to a wire spring clip that is moveably retained on the back plate, the wire spring clip comprising:

a length of wire shaped to form a connection portion configured to capture the second mounting flange against the back plate when the wire spring clip is in an engagement position, and a flat spring formed by a portion of the length of wire and configured to flex against one or more spring stop features and to provide a biasing force that urges the wire spring clip towards the engagement position;

the force being sufficient to overcome the urging of the flat spring toward the engagement position and to move the wire spring clip to a release position such that the connection portion is not positioned to capture the second of the two mounting flanges;

placing the second mounting flange against the back plate; and releasing the force on the wire spring clip so that the biasing force of the flat spring moves the wire spring clip to the engagement position such that the connection portion captures the second mounting flange against the back plate.

13. The method of claim 12 comprising applying the force to the wire spring clip until further movement of the wire spring clip is prevented by the wire spring clip contacting a spring limiting feature on the back plate.

14. The method of claim 12 where the force is applied to an extension portion of the wire spring clip formed by two substantially linear portions of the wire disposed parallel to one another and connected to one another at a distal end by a connecting portion of the wire.

15. A rail adapter apparatus that connects an electrical component to a mounting rail having two spaced elongate mounting flanges on either side of an elongate middle portion, the method comprising:

a backing means that provides a mounting means for the electrical component, a fixed mounting means for fixing a first of the two mounting flanges to the backing means, and one or more clip retaining means; and a moveable clip means moveably attached to the backing means with the clip retaining means, the clip means configured to be moved between an engagement position in which the clip means engages and fixes a second of the two mounting flanges to the backing means and a release position in which the clip means is released from the second mounting flange;

the clip means comprising a rail engaging means configured to overlay and capture the second mounting flange against the backing means and a biasing means that provides a biasing force that urges the clip means to the engagement position.

* * * * *